US010152253B2

(12) United States Patent
Zianbetov et al.

(10) Patent No.: US 10,152,253 B2
(45) Date of Patent: Dec. 11, 2018

(54) DATA BACK-UP IN AN ASYNCHRONOUS CIRCUIT

(71) Applicants: Commissariat à l'Énergie Atomique et aux Énergies Alternatives, Paris (FR); Centre National de la Recherche Scientifique, Paris (FR)

(72) Inventors: Eldar Zianbetov, Grenoble (FR); Edith Beigne, Meaudre (FR); Gregory Di Pendina, Echirolles (FR)

(73) Assignees: Commissariat à l'Énergie Atomique et aux Énergies Alternatives, Paris (FR); Centre National de la Recherche Scientifique, Paris (FR)

( * ) Notice: Subject to any disclaimer, the term of this patent is extended or adjusted under 35 U.S.C. 154(b) by 149 days.

(21) Appl. No.: 15/416,705

(22) Filed: Jan. 26, 2017

(65) Prior Publication Data

US 2017/0212702 A1    Jul. 27, 2017

(30) Foreign Application Priority Data

Jan. 27, 2016   (FR) ...................................... 1650644

(51) Int. Cl.
*G06F 12/00* (2006.01)
*G06F 3/06* (2006.01)
(Continued)

(52) U.S. Cl.
CPC ............ *G06F 3/0619* (2013.01); *G06F 3/065* (2013.01); *G06F 3/067* (2013.01); *G06F 9/38* (2013.01);
(Continued)

(58) Field of Classification Search
CPC ........ G06F 3/0619; G06F 3/065; G06F 3/067; G06F 9/38; G06F 12/0238;
(Continued)

(56) References Cited

U.S. PATENT DOCUMENTS 6,356,117 B1 *   3/2002   Sutherland ................ G06F 7/00
                                                    326/93
6,862,226 B2     3/2005   Toyoda et al.
(Continued)

FOREIGN PATENT DOCUMENTS

DE              19929600 A1      3/2000
WO    WO 2012/171988 A1         12/2012
WO    WO 2014/110566 A1          7/2014

OTHER PUBLICATIONS

French Search Report for Application No. FR 1650644 dated Dec. 16, 2016.

*Primary Examiner* — Shawn X Gu
(74) *Attorney, Agent, or Firm* — Wolf, Greenfield & Sacks, P.C.

(57) ABSTRACT

An asynchronous circuit including an asynchronous pipeline including two or more stages, each stage having: a buffering circuit for temporarily storing data to be transferred from one stage to the next based on a handshake protocol, the buffering circuit including a non-volatile memory; and a data presence detection circuit adapted to generate a data presence detection value indicating whether or not data is stored by the buffering circuit; and a control circuit adapted to perform a data back-up operation by independently controlling each buffering circuit to back-up the data it stores to its non-volatile memory based on the corresponding data presence detection value.

10 Claims, 7 Drawing Sheets

(51) Int. Cl.
*G06F 11/14* (2006.01)
*G06F 12/02* (2006.01)
*G06F 9/38* (2018.01)
*H03K 19/017* (2006.01)
*H03K 19/20* (2006.01)

(52) U.S. Cl.
CPC ...... *G06F 11/1458* (2013.01); *G06F 12/0238* (2013.01); *G06F 12/0246* (2013.01); *H03K 19/01707* (2013.01); *H03K 19/20* (2013.01)

(58) Field of Classification Search
CPC ............. G06F 12/0246; G06F 11/1458; H03K 19/01707; H03K 19/20
See application file for complete search history.

(56) References Cited

U.S. PATENT DOCUMENTS

| | | |
|---|---|---|
| 2013/0198549 A1 | 8/2013 | Longnecker et al. |
| 2013/0286721 A1 | 10/2013 | Jung et al. |

* cited by examiner

DATA BACK-UP IN AN ASYNCHRONOUS CIRCUIT

CROSS-REFERENCE TO RELATED APPLICATION

This application claims priority to French Application No. 16/50644, filed Jan. 27, 2016, which application is incorporated herein by reference to the maximum extent allowable by law.

FIELD

The present disclosure relates to the field of asynchronous circuits, and in particular to an asynchronous pipeline having non-volatile data storage capabilities.

BACKGROUND

In contrast with synchronous circuit designs that rely on a clock signal, asynchronous circuits have the advantage of being more or less insensitive to delay variations resulting for example from variations in the manufacturing process. Furthermore, by avoiding the use of a clock, asynchronous circuits have relatively low power consumption. Asynchronous circuits are generally designed to operate based on events determined using a specific handshake protocol.

The basic circuit element of an asynchronous design is based on a circuit known as a C-element or Muller circuit. This circuit includes a volatile latch for storing a state. Thus if the asynchronous circuit is powered down, the data stored by the various C-elements will be lost.

It would be desirable to provide the C-element with the capability of non-volatile storage, so that the state of the circuit can be restored following power down. However, a problem is that non-volatile data storage operations tend to consume relatively high levels of energy. There is thus a need in the art for a system for data back-up in an asynchronous pipeline that permits energy consumption to be reduced at least some of the time.

SUMMARY

It is an aim of embodiments of the present description to at least partially address one or more problems in the prior art.

According to one aspect, there is provided an asynchronous circuit comprising: an asynchronous pipeline comprising two or more stages, each stage having: a buffering circuit for temporarily storing data to be transferred from one stage to the next based on a handshake protocol, the buffering circuit including a non-volatile memory; and a data presence detection circuit adapted to generate a data presence detection value indicating whether or not data is stored by the buffering circuit; and a control circuit adapted to perform a data back-up operation by independently controlling each buffering circuit to back-up the data it stores to its non-volatile memory based on the corresponding data presence detection value.

According to one embodiment, the data presence detection circuit comprises a further non-volatile memory adapted to store the data presence detection value, the control circuit being adapted to control each data presence detection circuit to restore the data presence detection value from the further non-volatile memory during a power-up phase.

According to one embodiment, each of the data presence detection circuits is adapted to generate the data presence detection value based on the state of an acknowledgement signal received from a next stage of the pipeline, and on an acknowledgement signal generated by the corresponding buffering circuit.

According to one embodiment, the asynchronous pipeline comprises one or more pairs of data lines and an acknowledgement line coupling the buffering circuit of each pipeline stage to the next, the buffering circuits being configured to implement a four-phase handshake protocol for the transfer of a data token from one pipeline phase to the next, the four-phase handshake protocol comprising bringing the acknowledgement signal on the acknowledgement line from a first state to a second state and back to the first state, and the data presence detection circuit of a first pipeline stage being adapted to generate a data presence detection value indicating that data is present in the buffering circuit of the first pipeline stage when the acknowledgement signal from the next pipeline stage is in the first state and the acknowledgement signal generated by the buffering circuit of the first pipeline stage is in the second state.

According to one embodiment, the control circuit comprises a non-volatile memory storing a token table indicating the presence of data tokens in the asynchronous pipeline.

According to one embodiment, the buffering circuit of each pipeline stage is a half-buffer comprising first and second C-elements, each C-element comprising: first and second input nodes and first and second inverters cross-coupled between first and second complementary storage nodes, the second storage node forming an output node of the C-element; and a non-volatile memory comprising: a first resistive element having a first terminal coupled to the first storage node; a second resistive element having a first terminal coupled to the second storage node, at least one of the first and second resistive elements being programmable to have one of at least two resistive states, a data value being represented by the relative resistances of the first and second resistive elements, a second terminal of the first resistive element being coupled to a second terminal of the second resistive element via a first transistor; and the control circuit being adapted, during a backup phase of a data bit stored at the first and second storage nodes to the non-volatile memory, to render conductive the first transistor while different logic levels are applied to the first and second input nodes of the C-element.

According to one embodiment, the first transistor is adapted to conduct a write current during the backup phase, and the circuit of the C-element is arranged such that the write current passes through at least one transistor of each of the first and second inverters during the write phase.

According to one embodiment, the first and second C-elements are each adapted to receive a first input signal at the first input node and a second input signal at the second input node; and the first inverter comprises: first and second transistors having their control nodes coupled to the first or second storage node; third and fourth transistors coupled in parallel with each other and coupling the first transistor of the first inverter to a supply voltage rail; and fifth and sixth transistors coupled in parallel with each other and coupling the second transistor of the first inverter to the ground voltage rail.

According to one embodiment, at least one of the first and second resistive elements is one of: a spin transfer torque element with in-plane anisotropy; a spin transfer torque element with perpendicular-to-plane anisotropy; a reduction oxide element; a ferro-electric element; and a phase change element.

According to a further aspect, there is provided a method of data back-up in an asynchronous pipeline comprising two or more pipeline stages, the method comprising: generating, by a data presence detection circuit of each pipeline stage, a data presence detection value indicating whether or not data is being stored by a buffering circuit of each pipeline stage, the buffering circuits temporarily storing data to be transferred from one stage to the next based on a handshake protocol, each buffering circuit comprising a non-volatile memory; and performing a data back-up operation by independently controlling each buffering circuit to back-up the data it stores to its non-volatile memory based on the corresponding data presence detection value.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between to elements, whereas the term "coupled" is used to designate a connection that could be direct, or could be via one or more intermediate elements such as resistors, capacitors or transistors.

Figure 1:
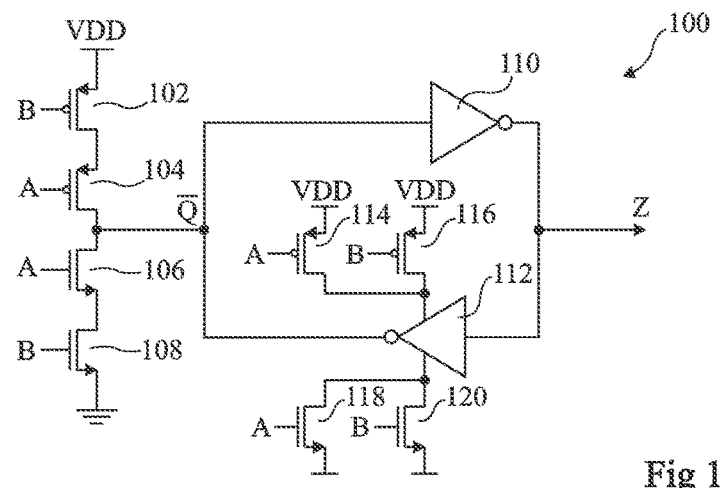
FIG. 1 schematically illustrates an example of a C-element.

FIG. 1 illustrates an example of a C-element 100, also known as a Muller circuit. It comprises a pair of data input nodes for receiving input signals A and B. A pair of transistors 102, 104, which are for example PMOS transistors, are coupled in series with each other between a supply voltage rail VDD and a storage node $\overline{Q}$ of the C-element. A further pair of transistors 106, 108, which are for example NMOS transistors, are coupled in series with each other between the storage node $\overline{Q}$ and a ground voltage rail. The transistors 104 and 106 have their control nodes coupled to the input node receiving the signal A, and the transistors 102 and 108 have their control nodes coupled to the input node receiving the signal B.

Two inverters 110, 112 are cross-coupled between the storage node $\overline{Q}$ and a further storage node Z, which forms the output node of the C-element. The inverter 112 for example has its input coupled to the storage node Z and its output coupled to the storage node $\overline{Q}$, and has its supply terminals coupled to the supply voltage rails via further transistors. In particular, a high supply terminal of inverter 112 is coupled to the supply voltage rail VDD via each of a pair of transistors 114, 116, which are for example PMOS transistors, coupled in parallel with each other. The low supply terminal of inverter 112 is coupled to the ground voltage rail via each of a pair of transistors 118, 120, which are for example NMOS transistors, coupled in parallel with each other. The transistors 114 and 118 have their control nodes coupled to the input node for receiving the signal A, and the transistors 116 and 120 have their control nodes coupled to the other input node for receiving the signal B.

In operation, the C-element for example has an operation defined by the following truth table:

| A | B | Z |
|---|---|---|
| 0 | 0 | 0 |
| 0 | 1 | $Z^{-1}$ |
| 1 | 0 | $Z^{-1}$ |
| 1 | 1 | 1 |

In other words, when the values of the input signals A and B are at the same logic level, the output Z is set to this logic level. When the values of the input signals A and B are at different logic levels from each other, the circuit is in a standby state in which the output Z remains unchanged, in other words the voltage state at the storage nodes $\overline{Q}$ and Z is not modified.

Figure 2:
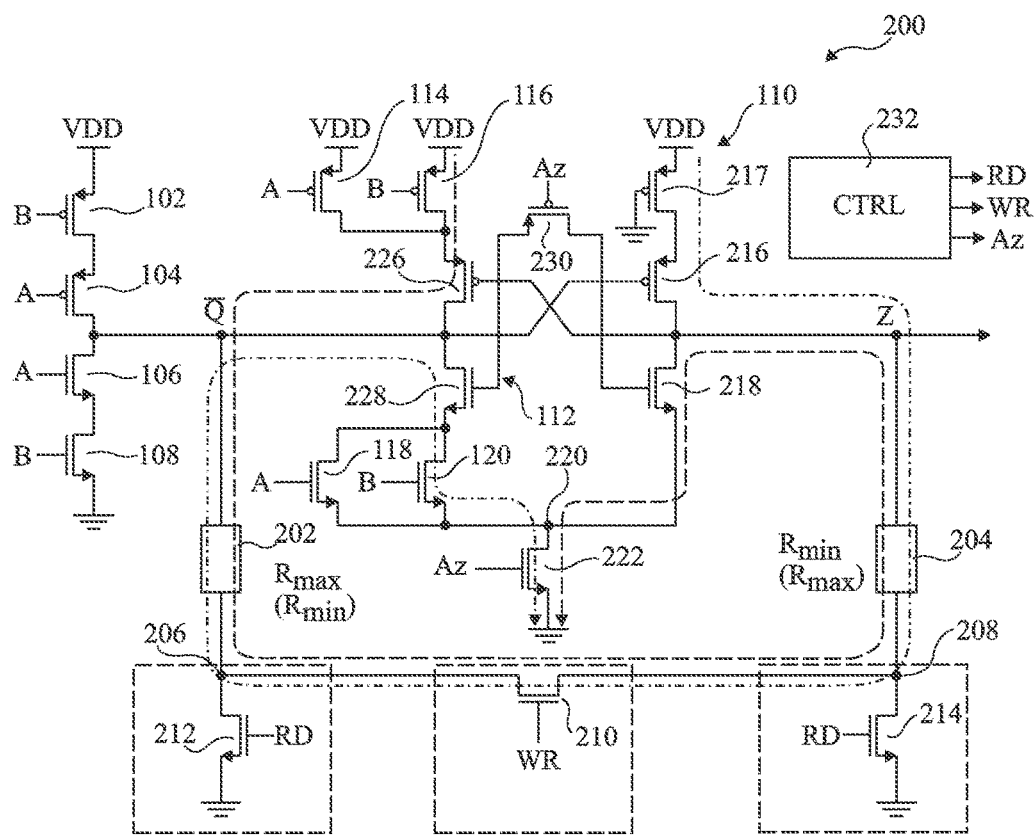
FIG. 2 schematically illustrates an example of a circuit comprising a C-element and a non-volatile memory.

FIG. 2 illustrates a circuit 200 comprising the C-element 100 of FIG. 1, to which has been added a non-volatile memory. The features of the C-element 100 have been labeled with like references in FIG. 2, and will not be described again in detail. The circuit of FIG. 2 is described in more detail in the French patent application assigned filing no. FR14/58289, in the European patent application assigned filing no. EP15183551 and in the U.S. patent application Ser. No. 14/845213, the contents of these applications being hereby incorporated by reference to the extent permitted by the law.

The circuit 200 of FIG. 2 comprises a pair of resistive elements 202, 204, which are each capable of being programmed to have one of a plurality of resistive states. The resistive elements 202 and 204 may be any type of resistance switching element for which the resistance is programmable by the direction of a current passed through it. For example, the resistance switching elements 202, 204 are spin transfer torque elements with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. Alternatively, the resistive elements could be those used in RedOx RAM (reduction oxide RAM) resistive switching memories, which are for example described in more detail in the publication entitled "Redox-Based Resistive Switching Memories—Nanoionic Mechanisms, Prospects and Challenges", Rainer Waser et al., Advanced Materials 2009, 21, pages 2632 to 2663. As yet a further example, the resistive elements could be those used in FeRAM (Ferro-Electric RAM) or in PCRAM (phase change RAM).

Whatever the type of resistive elements, a bit of data is for example stored in a non-volatile manner by setting one of the elements at a relatively high resistance ($R_{max}$), and the other at a relatively low resistance ($R_{min}$). In the example of FIG. 2, the element 202 is programmed to have a resistance $R_{max}$ and the element 204 a resistance $R_{min}$ representing one value of the data bit, and as shown by the references $R_{min}$ and $R_{max}$ in brackets, the opposite programming of the resistance values stores the opposite value of the data bit. Each of the resistance switching elements 202, 204 for example has just two resistive states corresponding to the high and low resistances $R_{max}$ and $R_{min}$, but the exact values of $R_{min}$ and $R_{max}$ may vary depending on conditions such as process, materials, temperature variations etc.

The non-volatile data bit represented by the resistive elements 202, 204 depends on which of the resistive elements is at the resistance $R_{max}$ and $R_{min}$, in other words on the relative resistances. The resistive elements 202, 204 are for example selected such that $R_{max}$ is always significantly greater than $R_{min}$, for example at least 20 percent greater. In general, the ratio between the resistance $R_{max}$ and the resistance $R_{min}$ is for example between 1.2 and 10000. $R_{min}$ is for example in the region of 2 k ohms or less, and $R_{max}$ is for example in the region of 6 k ohms or more, although many other values are possible.

It will be apparent to those skilled in the art that in some embodiments, rather than both of the resistive elements 202, 204 being programmable, only one is programmable. In such a case, the other resistive element for example has a fixed resistance at an intermediate level around halfway between $R_{min}$ and $R_{max}$, for example equal, within a 10 percent tolerance, to $(R_{min}+(R_{max}-R_{min})/2)$. For example, one of the resistive elements 202, 204 could correspond to a resistor of fixed resistance. Alternatively, one of the resistive elements 202, 204 could be formed of a pair of programmable resistive elements coupled in parallel with each other and in opposite orientations, such irrespective of the sense in which each element is programmed, the resistance value remains relatively constant at the intermediate level.

The resistive element 202 is coupled between the storage node $\overline{Q}$ and an intermediate node 206. The resistive element 204 is coupled between the storage node Z and an intermediate node 208. The intermediate nodes 206 and 208 are coupled together via a transistor 210, which is for example an NMOS transistor. Transistor 210 receives at its control node a write signal WR.

The node 206 is further coupled to the ground voltage rail via a transistor 212, which is for example an NMOS transistor. Similarly, the node 208 is further coupled to the ground voltage rail via a transistor 214, which is also for example an NMOS transistor. Control nodes of the transistors 212 and 214 are controlled by a read signal RD.

FIG. 2 also illustrates the inverters 110 and 112 in more detail. Inverter 110 for example comprises a transistor 216, which is for example a PMOS transistor, coupled between the storage node Z and the supply voltage rail VDD. Optionally, for the purpose of balancing the read paths during a restoration phase described in more detail below, a further transistor 217, which is for example a PMOS transistor, is coupled between the transistor 216 and the supply voltage rail VDD. The inverter 110 also for example comprises a transistor 218, which is for example an NMOS transistor, coupled between the storage node Z and a common node 220. In some embodiments the common node 220 is connected to the ground voltage rail, whereas in alternative embodiments as shown in FIG. 2, the common node 220 is coupled to the ground voltage rail via a transistor 222, which is for example an NMOS transistor controlled by a signal Az discussed in more detail below.

Inverter 112 for example comprises a transistor 226, which is for example a PMOS transistor, coupled between the storage node $\overline{Q}$ and the high voltage terminal of the inverter 112. The inverter 112 also for example comprises a transistor 228, which is for example an NMOS transistor, coupled between the storage node $\overline{Q}$ and the low voltage terminal of the inverter 112. The transistors 118 and 120 are coupled between the low voltage terminal of inverter 112 and the common node 220. Optionally, a transistor 230, which is for example a PMOS transistor having its control node coupled to receive the signal Az, is coupled between the storage nodes $\overline{Q}$ and Z.

FIG. 2 also illustrates a control block 232, providing the control signals RD, WR and Az to the corresponding transistors of the circuit 200.

Figure 3:
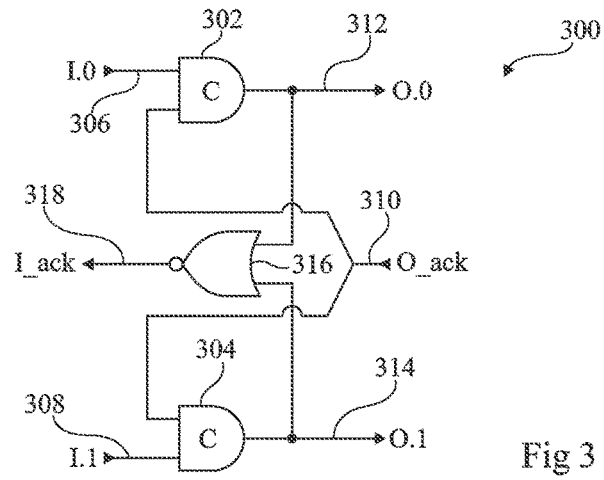
FIG. 3 schematically illustrates an asynchronous half-buffer according to an example embodiment.

FIG. 3 schematically illustrates a half-buffer 300 formed of a pair of C-elements 302, 304. Such a half-buffer for example forms a main portion of each stage of an asynchronous pipeline, as will be described more detail below. The C-element 302 has one of its inputs coupled to a data input line 306 receiving an input data signal I.0, and its other input coupled to a data input line 308 receiving a data input signal I.1. The other inputs of the C-elements 302 and 304 are coupled to an acknowledgement line 310 receiving an acknowledgement signal O_ack. The outputs of the C-elements 302, 304 are coupled to output data lines 312 and 314 respectively, the line 312 providing an output data signal O.0, and the line 314 providing an output data signal O.1. The lines 312 and 314 are also coupled to respective inputs of a two-input NOR gate 316, which provides at its output an acknowledgement signal I_ack on an acknowledgement line 318.

A data bit is transmitted on the input data lines 306, 308 and on the output data lines 312, 314 using a protocol according to which:

logic states "01" on the lines I.0 and I.1 respectively or on the lines O.0 and O.1 respectively for example transmits a logical "1" bit;

logic states "10" on the lines I.0 and I.1 respectively or on the lines O.0 and O.1 respectively for example transmits a logical "0" bit;

logic states "00" on the lines I.0 and I.1 or on the lines O.0 and O.1 for example indicates an idle state in which no data is transmitted; and logic states "11" on the lines I.0 and I.1 or on the lines O.0 and O.1 is for example a forbidden state.

Figure 4A:
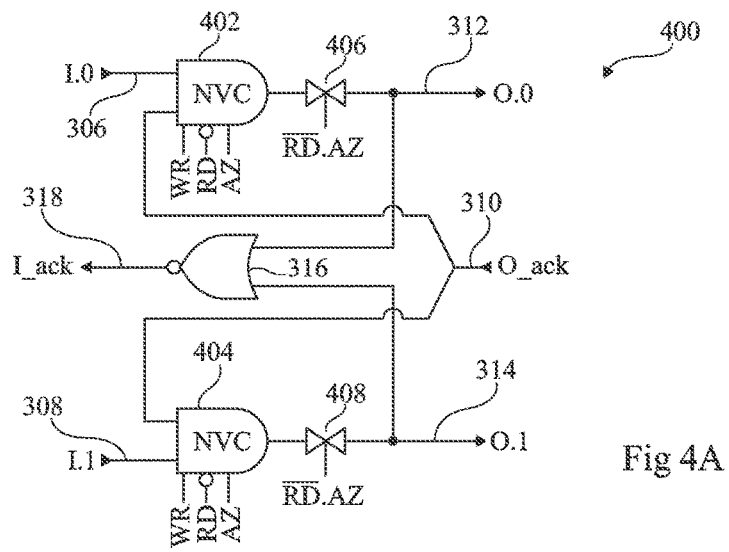
FIG. 4A schematically illustrates a 1-bit asynchronous half-buffer with non-volatile data storage according to an example embodiment of the present disclosure.

FIG. 4A schematically illustrates a half-buffer 400 very similar to that of FIG. 3, and like features are labelled with like reference numerals and will not be described again in detail. However, in the half-buffer 400, the C-elements 302, 304 are replaced by C-elements 402, 404 respectively, each having non-volatile data storage capacity. For example, these C-elements 402, 404 are each implemented by the circuit of FIG. 2, and receive input signals WR, RD and Az described in relation to FIG. 2. Furthermore, a gate 406 is connected between the output of the C-element 402 and the output line 312, and couples the output of the C-element 402 to the output line 312 only when the signal Az and the inverse $\overline{RD}$ of the signal RD are asserted. Similarly, a gate 408 is connected between the output of the C-element 404 and the output line 314, and couples the output of the C-element 404 to the output line 314 only when the signal Az and the inverse $\overline{RD}$ of the signal RD are asserted. These gates 406, 408 for example prevent the outputs of the C-elements 402, 404 from being propagated while they are in unstable states, for example while data is being restored from the non-volatile elements 202, 204 to the storage nodes $\overline{Q}$ and Z.

While in the example of FIG. 4A the half-buffer has a single pair of C-elements 402, 404 permitting a single bit of data to be transmitted at a time using the input data lines 306, 308 and output data lines 312, 314, in alternative embodiments further pairs of C-elements, and further input and output lines, could be provided to more than one bit of data to be transmitted at a time, as will now be described in more detail with reference to FIG. 4B.

Figure 4B:
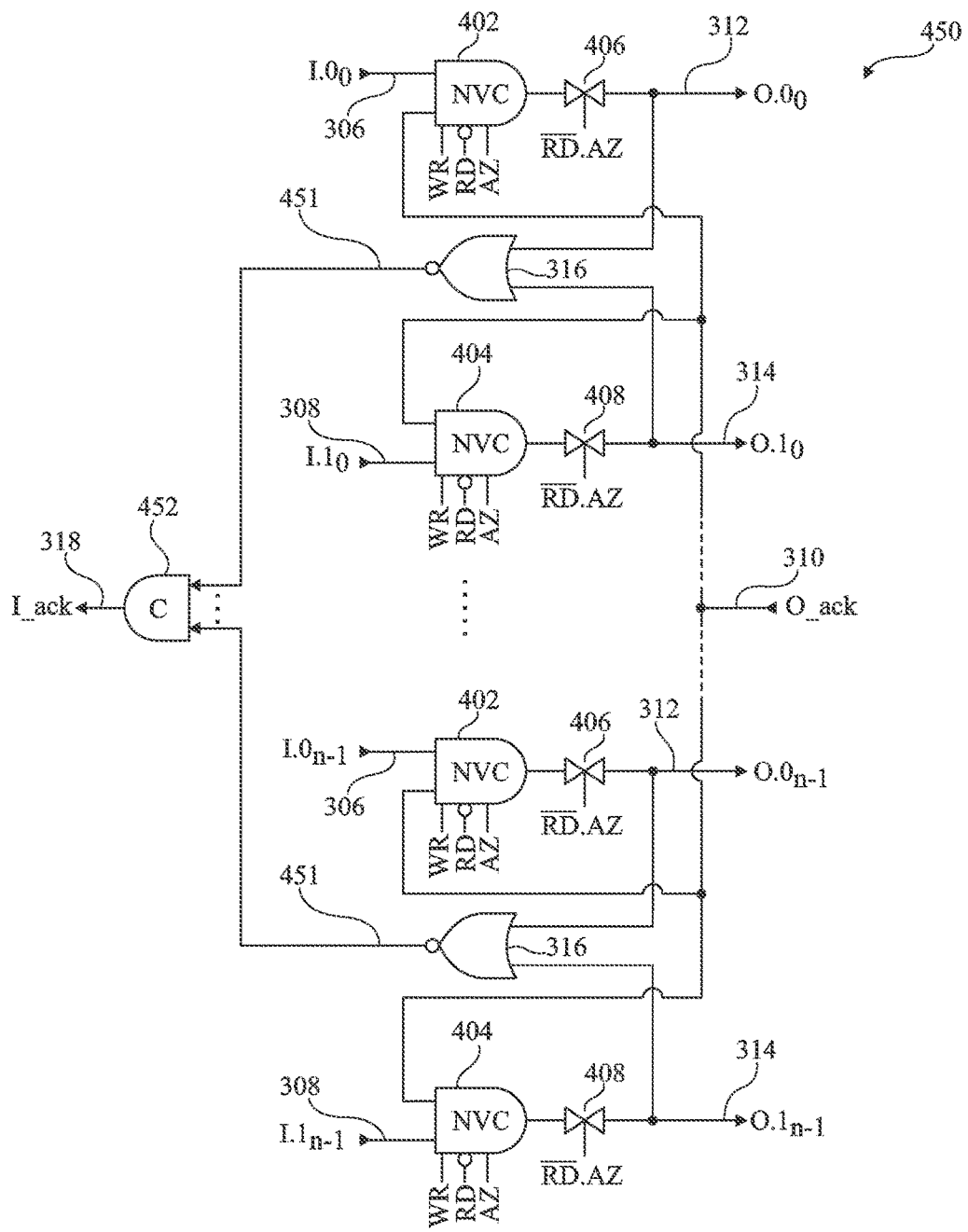
FIG. 4B schematically illustrates an n-bit asynchronous half-buffer with non-volatile data storage according to an example embodiment of the present disclosure.

FIG. 4B schematically illustrates a half-buffer 450 similar to the half-buffer 400 of FIG. 4A, and like features are labelled with like reference numerals and will not be described again in detail. However, the half-buffer 450 is an n-bit half-buffer that has a plurality 2n of input data lines $I.0_0$, $I.1_0$ to $I.0_{n-1}$, $I.1_{n-1}$ and a plurality 2n of output data lines $O.0_0$, $O.1_0$ to $O.0_{n-1}$, $O.1_{n-1}$. In such a case, pairs of the C-elements are for example equipped with a local acknowledgement circuit formed by the NOR gate 316. Each NOR gate 316 provides its output on a line 451, and these outputs are for example merged onto the signal acknowledgement output line 318, for example by a C-element 452.

Figure 5A:
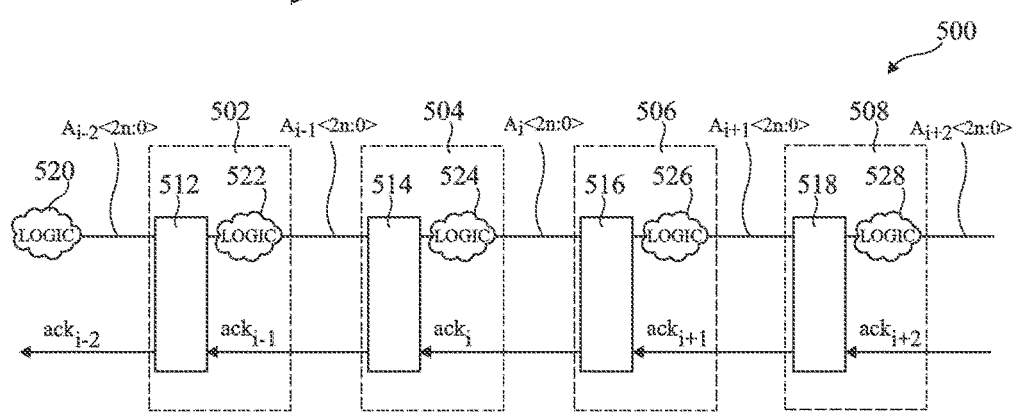
FIG. 5A schematically illustrates an asynchronous pipeline according to an example embodiment of the present disclosure.

FIG. 5A schematically illustrates an asynchronous pipeline 500 according to an example embodiment. The pipeline for example comprises at least two pipeline stages coupled in series. In the example of FIG. 5A, there are four pipeline stages 502, 504, 506 and 508. Each pipeline stage 502, 504, 506 and 508 respectively comprising a half-buffer 512, 514, 516 and 518, which is for example implemented by the circuit 400 of FIG. 4A. The half-buffers 512, 514, 516 and 518 for example respectively receive n-bit data signals on lines $A_{i-2}$<2n−1:0>, $A_{i-1}$<2n−1:0>, $A_i$<2n−1:0> and $A_{i+1}$<2n−1:0>. The lines $A_{i-2}$<2n−1:0> are for example coupled to the output of a logic circuit 520. Furthermore, the data output lines of the half buffers 512, 514, 516 and 518 of each stage are respectively coupled to logic circuits 522, 524, 526 and 528 of each stage, which provide output signals to the next stage, or the output signal of the pipeline in the case of the final stage 508. The half-buffers 512, 514, 516 and 518 of each stage are also coupled to acknowledgement lines for receiving the acknowledgement signal from the next stage, and transmitting the acknowledgement signal to a previous stage. For example, the stage 506 is considered to be an ith stage in the pipeline, and has input data lines $A_i$<2n−1:0> for receiving data signals from the logic circuit 524 of the previous stage, generates an ith acknowledgement signal $ack_i$, and receives an (i+1)th acknowledgement signal $ack_{i+1}$ from the half-buffer 518 of the next stage 508.

While not illustrated in FIG. 5A, the pipeline is for example terminated by a buffer capable of storing the data from the pipeline and of generating an acknowledgement signal to the last half-buffer of the pipeline. Alternatively, the pipeline may terminate with a half-buffer.

The data and acknowledgement signals during a data transfer of one bit from one stage to the next will now be described in more detail with reference to FIG. 5B.

Figure 5B:
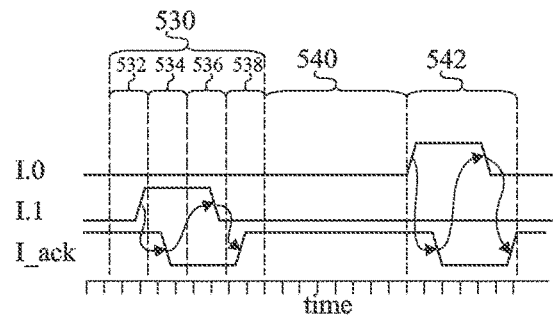
FIG. 5B is a timing diagram illustrating an example of signals in the circuit of FIG. 5A according to an example embodiment.

FIG. 5B is a timing diagram illustrating an example of the signals I.0, I.1 received by a half-buffer and the signal I_ack generated by the half-buffer 400 of FIG. 4A, which is for example part of one of the stages of the pipeline of FIG. 5A.

A four phase handshake protocol over dual rail connection line is for example used for each data transmission. As shown in FIG. 5B, during a data transmission sequence 530 of a logical "1", the four phases of the handshake protocol are labelled 532, 534, 536 and 538. During the phase 532, the input signal I.1 on line 308 is brought to the logical "1" level by the previous stage. The half-buffer responds in the phase 534 by bringing the acknowledgement signal I_ack on line 318 from a logical "1" to a logical "0". In the phase 536, the previous stage then brings the input signal I.1 back to a logical "0" level. The half-buffer responds in the phase 538 by returning the acknowledgement signal I_ack on the line 318 to a logical "1" level.

FIG. 5B also illustrates an idle state in which the signals I.0 and I.1 remain low and the signal I_ack remains high. FIG. 5B also illustrates a further sequence 542 for transmission of a logical "0", which is identical to the sequence 530, except that it is the signal I.0 that is brought to the logical "1" level.

Figure 6:
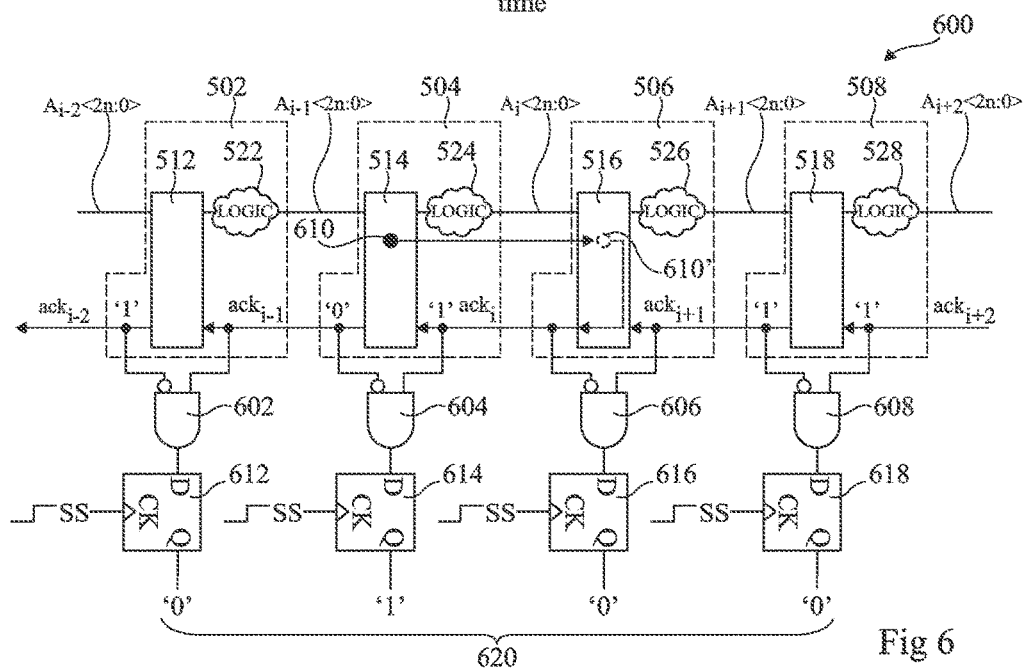
FIG. 6 schematically illustrates an asynchronous pipeline comprising data presence detection circuits according to an example embodiment of the present disclosure.

FIG. 6 schematically illustrates an asynchronous pipeline 600 similar to the pipeline 500 of FIG. 5A, but additionally comprising data presence detection circuits associated with each stage, as will now be described in more detail.

Advantageously, according to the embodiments described herein, data presence detection circuits indicate the presence of data in an asynchronous pipeline. This permits non-volatile data storage sequences to be triggered only for those stages in which data is present, thereby avoiding energy consumption for pipeline stages in which there is no data. For example, a non-volatile back-up phase is triggered in order to permit power gating to be performed. Power gating is a technique used to reduce energy consumption by disconnecting circuits from the supply voltage when they are idle. Such a technique is for example described in more detail in United Patent Application published as US2013/0198549, the contents of which is hereby incorporated by reference to the extent permitted by the law.

Each of the pipeline stages 502, 504, 506 and 508 in FIG. 6 is for example associated with a data presence detection circuit implemented by a two-input AND gate 602, 604, 606 and 608 respectively, each AND gate having one of its inputs coupled to the acknowledgement input line from the next stage (the line 310 in FIG. 3) and the other of its inputs coupled to the acknowledgement output line to the previous stage (the line 318 in FIG. 3). The input coupled the acknowledgement output line is for example inverted, such that when the signal I_ack on this line is low, and the input acknowledgement signal O_ack from the next stage is high, the output of the AND gate is asserted to indicate that data is stored by the half-buffer. Indeed, with reference to FIG. 5B, this state corresponds to the phase 534, the phase 536 and part of the phase 538, during which the signal I_ack is low indicating that data has been transferred from the previous stage, and the signal O_ack from the next stage has not yet gone low, indicating that the data has not yet transferred to the next stage. In some cases it may be possible for the acknowledgement signal $ack_i$ to go low before the signal $ack_{i+1}$ returns to a high level.

In an example of FIG. 6, an n-bit data value 610 has been received by the half-buffer 514, and the acknowledgement signal $ack_{i-1}$ to the previous half-buffer 512 has been brought low, so that the data is released. Thus the half-buffer 514 is storing the data, and the signal at the output of the AND gate 604 is high. This n-bit data value is then transmitted to the subsequent stage 506, as represented by a dashed dot 610'. The data value is issued from the half-buffer 514 and processed by the logic circuit 524, before being acquired by the half-buffer 516. The acknowledgement signal $ack_i$ is then brought low to indicate that the data has been acquired, and as such that data value will then have transferred to the half-buffer 516.

In some embodiments, the output of each of the AND gates 602, 604, 606 and 608 is coupled to an output circuit 612, 614, 616 and 618 respectively, which is adapted to sample the output signal of the AND gate when a save state (SS) signal is asserted. For example, each of the output circuits 612 to 616 is implemented by a flip-flop having its D input connected to the output of the corresponding AND gate 602 to 608 respectively, its clock input receiving the save state signal SS, and its Q output providing the data presence indication bit for the corresponding pipeline stage. The data presence indication bits 620 from each of the output circuits 612 to 618 are for example used by a non-volatile memory controller associated with each half-buffer during a non-volatile store operation to store only the data held by half-buffers containing data.

While one particular example implementation of the data presence detection circuits is shown in FIG. 6, in alternative embodiments, other implementations would be possible. For example, in some embodiments a logical "1" on any of the data input lines of a half-buffer while the acknowledgement signal I_ack at the output of the half-buffer is low can be used as an indication of data being stored by the half-buffer. Furthermore, the technique described in the publication by Y. Thonnart et al. entitled "Automatic Power Regulation Based on an Asynchronous Activity Detection and its Application to ANOC Node Leakage Reduction", ASYNC2008, could also be employed, the contents of this publication being incorporated herein by reference to the extent permitted by the law. An advantage of basing the data presence detection on the acknowledgement signals alone is that the detection circuits can be of relatively low complexity.

Figure 7:
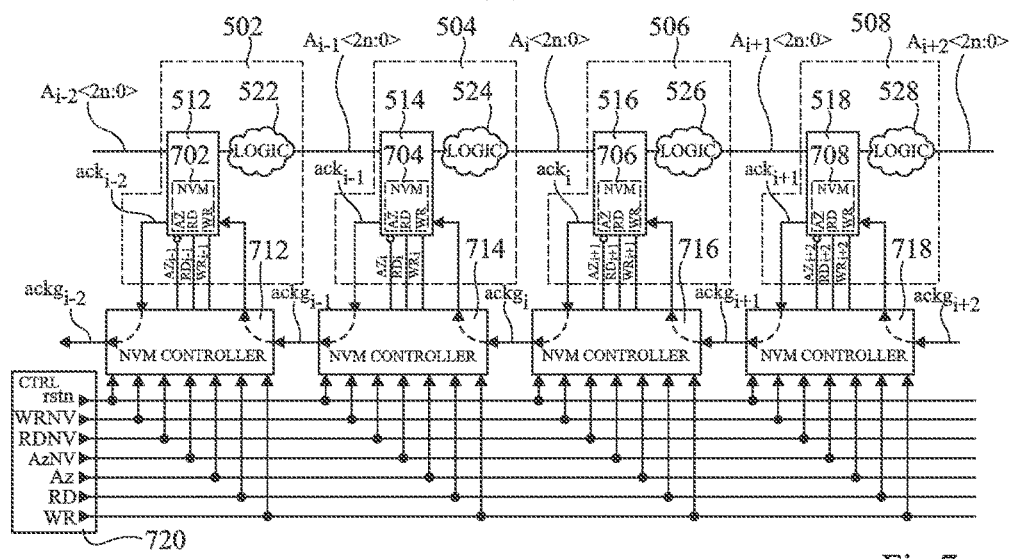
FIG. 7 schematically illustrates an asynchronous pipeline comprising non-volatile data storage controllers according to an example embodiment of the present disclosure.

FIG. 7 illustrates the asynchronous pipeline 600 in more detail according to an example embodiment. Each of the half-buffers 512, 514, 516 and 518 for example comprises a corresponding non-volatile memory 702, 704, 706 and 708, for example implemented within each C-element as described above in relation to FIG. 2. Furthermore, FIG. 7 illustrates an example in which non-volatile memory (NVM) controllers (NVM CONTROLLER) 712, 714, 716 and 718 are associated with the pipeline stages 502, 504, 506 and 508 respectively. Each NVM controller 702 to 708 for example comprises a corresponding one of the data presence detection circuits 602 to 608 of FIG. 6, as well as circuits for implementing the data back-up and restoration operations, as will be described in more detail below. The NVM controllers 712 to 718 each for example provides local control signals $AZ_i$, $RD_i$ and $WR_i$ to the corresponding non-volatile memories 702 to 708 of the half-buffers 512 to 518. Indeed, the NVM controllers for example each comprise circuitry implementing the control circuit 232 of FIG. 2 for controlling each non-volatile C-element.

In the example of FIG. 7, the acknowledgement signals to and from each half-buffer 512 to 518 for example pass through the corresponding NVM controller 712 to 718, so that these signals are frozen during data backup and restoration operations, thereby temporarily preventing data from moving through the pipeline for a time sufficient for the successful completion of these operations. As illustrated in FIG. 7, the acknowledgement signals generated by the half-buffers 512 to 518 are respectively labelled $ack_{i-2}$ to $ack_{i+i}$, and the acknowledgement signals received by the NVM controllers 712 to 718 from the NVM controller of the next stage are labelled $ackg_{i-1}$ to $ackg_{i+2}$.

Each NVM controller 712 to 718 for example comprises inputs for receiving, from a control circuit (CTRL) 720, the signals rstn, WRNV, RDNV, AzNV, Az, RD and WR, which will be described in more detail in relation with FIGS. 8 and 9.

Figure 8:
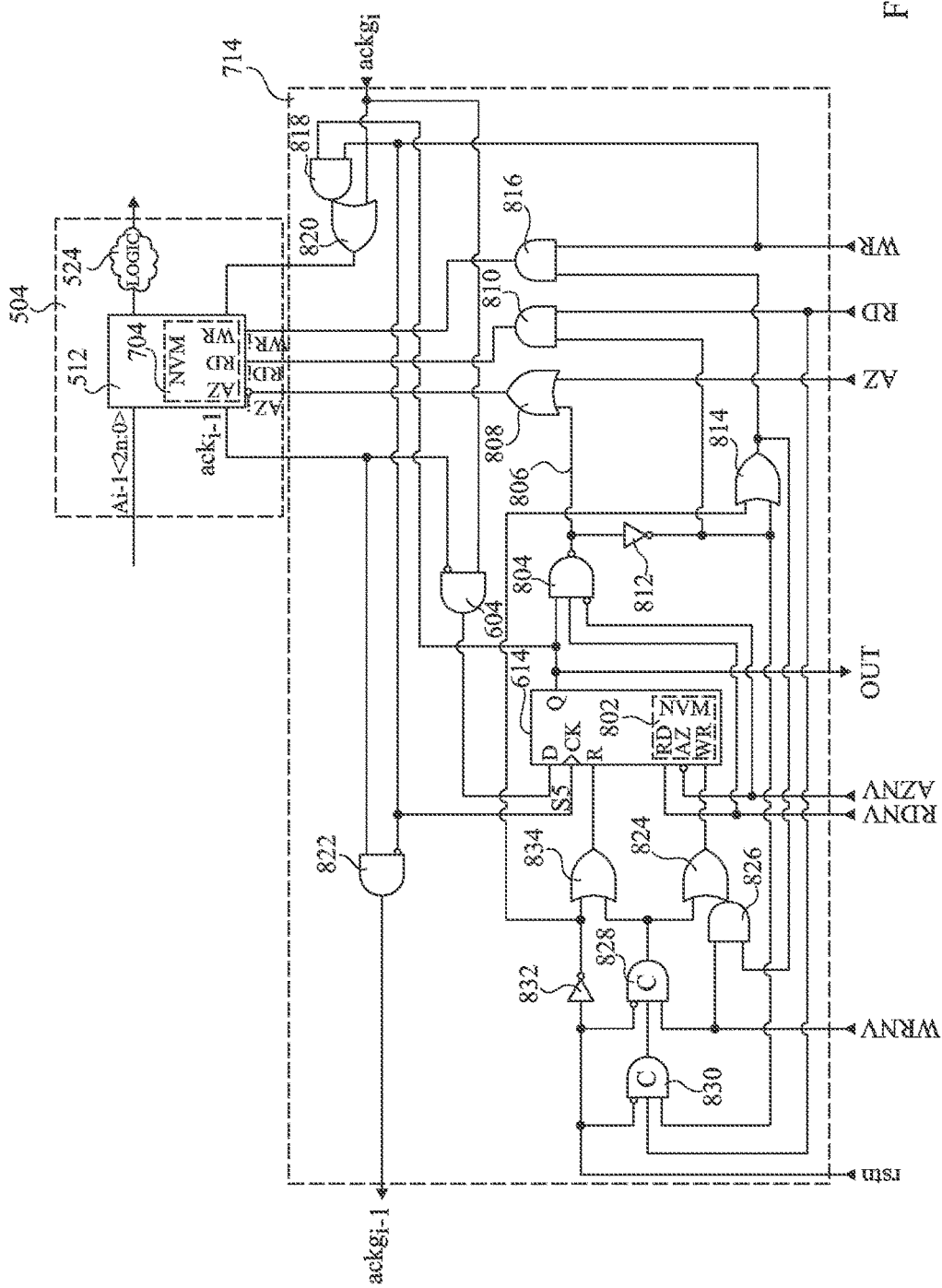
FIG. 8 schematically illustrates one of the non-volatile data storage controllers of FIG. 7 in more detail according to an example embodiment of the present disclosure.

FIG. 8 schematically illustrates the pipeline stage 504 and the corresponding NVM controller 714 in more detail according to an example embodiment. The other NVM controllers 712, 716 and 718 for example comprise similar circuits.

The output circuit 614 of the NVM controller 714 in the example of FIG. 8 is for example a D-type flip-flop comprising a non-volatile memory 802. The non-volatile flip-flop 814 is for example implemented by a pair of latches coupled in series, each latch for example being implemented by a circuit similar to the one of FIG. 2, but without the transistors 102 to 108, 114, 116, 118, 120 and 217. Alternatively, the non-volatile flip-flop 814 could be implemented by a device described in one of the following publications: International patent application published as WO2014/110566; United State Patent application published as US2013/0286721; and U.S. Pat. No. 6,862,226, the contents of these publications being incorporated herein by reference to the extent permitted by the law.

The data input of the flip-flop 614 is coupled to the output of the AND gate 604, which for example has one of its inputs coupled to receive the signal $ack_{i-1}$ on the acknowledgement output line of the half-buffer 514, this input being inverted, and its other input coupled to receive the acknowledgement signal $ackg_i$ on the acknowledgement line from the next stage. The data presence detection bit generated at the Q output of the flip-flop 614 is used to control whether or not data back-up or restoration operations are performed in the non-volatile memory 704 of the half-buffer 512. For example, the Q output of the flip-flop 614 is coupled to one input of a three-input NAND gate 804. Another input of the NAND gate 804 is coupled to the signal RDNV, and yet a further inverted input of the NAND gate 804 is coupled to the input signal AZNV. A line 806 at the output of the NAND gate 804 is coupled to one input of a two-input OR gate 808, which has its other input coupled to receive the signal AZ. The line 806 at the output of the NAND gate 804 is also coupled to one input of a two-input AND gate 810 via an inverter 812, the other input of the AND gate 810 being coupled to receive the signal RD. The output of the inverter 812 is also coupled to one input of a two-input OR gate 814, the other input of which is coupled to receive the inverse of the reset signal rstn. The output of the OR gate 814 is coupled to one input of two-input AND gate 816, the other input of which is coupled to receive the signal WR.

The signal WR is also coupled to one input of a two-input AND gate 818, the other input of which is coupled to the Q output of the flip-flop 614. The output of the AND gate 818 is coupled to one input of a two-input OR gate 820, the other input of which receives the acknowledgement signal $ackg_i$ from the NVM controller of the next stage of the pipeline. The output of the OR gate 820 is coupled to the acknowledgement input of the half-buffer 512.

The acknowledgement signal $ack_{i-1}$ generated by the half-buffer 512 is for example coupled to an input of a two-input AND gate 822, the other input of which is coupled to receive the inverted signal WR. This signal WR is also coupled to the clock input CK of the flip-flop 614. The output of the AND gate 822 provides the acknowledgement signal $ackg_{i-1}$.

The non-volatile memory of the flip-flop 614 for example receives the signal RDNV at its read input, the signal AZNV at its Az input, and the signal WR from the output of a two-input OR gate 824. The OR gate 824 has one input coupled to the output of a two-input AND gate 826, which in turn has one of its inputs coupled to the signal WRNV and its other input coupled to the output of the OR gate 814. The signal WRNV is also provided to one input of a two-input C-element with active low reset 828. A further reset input of the C-element 828 is inverted and coupled to the reset signal rstn, and the second input of the C-element 828 is coupled to the output of a further two-input C-element with active low reset 830. The C-element 828 has an inverted input coupled to receive the reset signal rstn and its other inputs respectively coupled to the output of the inverter 812 and to the read signal RD.

The reset signal rstn is inverted by an inverter 832 to provide the signal to the input of the OR gate 814. The output of the inverter 832 is also coupled to one input of a two-input OR gate 834, the other input of which is coupled to the output of the C-element 828, which is also coupled to an input of the OR gate 824. The output of the OR gate 834 is coupled to a reset input R of the flip-flop 614.

In some embodiments, the data presence detection value at the Q output of the flip-flop 614 also provides an output value OUT of each NVM controller, these lines being coupled to a control circuit so that the data presence detection values can be stored in a token table, as will be described in more detail below.

The signals WR, RD and AZ are global read and write signals for controlling back-up and restore operations to/from the non-volatile memory of the half-buffers, and these signals are only propagated as local control signals to the half-buffers if data is present. The signals WRNV, RDNV and AZNV are control signals for controlling back-up and restore operations to/from the non-volatile memory of the flip-flop 614. The signal rstn is a reset signal for initializing the states of the C-elements 830, 828 and of the flip-flop 614 following power-up.

In operation, when the write signal WR is asserted, the flip-flop 614 clocks the output of the AND gate 604, which indicates, based on an analysis of the acknowledgement signals, whether there is data held by the half-buffer 504. The clocked value from the AND gate 604 is for example stored in the non-volatile memory 802 prior to the pipeline entering a power-down state. This data can be recovered, during a recovery phase, upon power-up to indicate which half-buffers should be restored. The NAND gate 804 is used to prevent propagation of the undefined state at the output of the flip-flop 614 during the recovery phase.

The output of the NAND gate 804 is used to generate the local write signal $WR_i$ to the non-volatile memory 704 of the half-buffer 504, which will be asserted when the write signal WR is asserted and there is data in the half-buffer 504. Furthermore, the output of the flip-flop 614 is used to block, using the AND gate 818 and OR gate 820, the input acknowledgement signal from going low while the write signal WR is asserted. Similarly, the AND gate 822 blocks the acknowledgement signal $ackg_{i-1}$ from being asserted until the write signal WR has gone low. Thus a high pulse of the write signal WR causes a frozen state in which data propagation through the pipeline is suspended during the writing of the non-volatile memory 704. The duration of this high pulse is for example chosen to be long enough for this write operation to be performed. Once the write signal WR goes low, the acknowledgement signals are released, and the pipeline continues its normal operation from the frozen state.

The signal WRNV is used to write the detected data presence state stored by the flip-flop 614 to the non-volatile memory 802. Thus the signal WRNV is for example asserted once the detection operation has been performed by the AND gate 604 and the flip-flop 614 stores a valid logic level.

During power-up, the global reset signal rstn is used to reset the C-elements 828 and 830 and the flip-flop 614. Once all of the initial states have been set, the recovery phase occurs in which first the data bit stored by the non-volatile memory 802 is restored to the flip-flop 614 by a sequence of pulses of the signals RDNV and AZNV. During this recovery phase, the output Q of the flip-flop 614 is restored to the value of the detected data presence value, but this value is blocked by the NAND gate 804 while the signals RDNV and AZNV are asserted. A high level at the Q output of the flip-flop 614 permits the signals AZ and RD to pass through the gates 808 and 810 and control the non-volatile memory 704 to restore the stored data to the volatile storage of the half-buffer 512. Furthermore, a high output from the flip-flop 614 is used, via the inverter 812 and the C-elements 830, 828, to trigger a reset of the flip-flop 614 following recovery to erase the value held by the non-volatile memory 802. Indeed, the C-element 828 generates a high value if data was previously detected as being present and a high level of the signal WRNV arrives, causing the reset of the flip-flop 614 and overwrite of the non-volatile memory 802, and thereby preparing the flip-flop 614 for a subsequent cycle of data presence detection.

Figure 9:
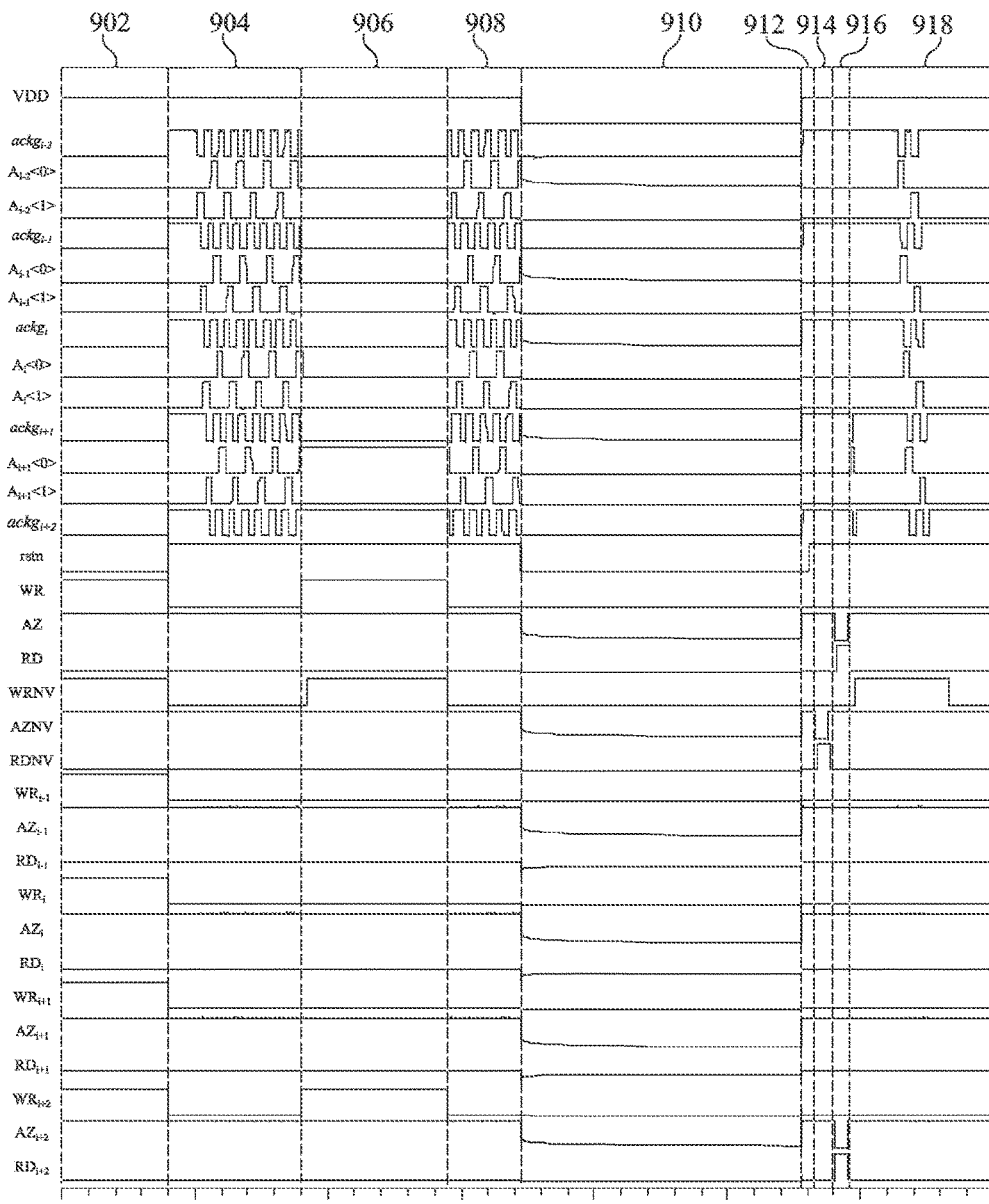
FIG. 9 is a timing diagram illustrating examples of signals in the asynchronous pipeline of FIG. 7 according to an example embodiment.

FIG. 9 is a timing diagram illustrating signals in the pipeline 600 of FIG. 7 according to an example embodiment. From top to bottom, FIG. 7 illustrates the supply voltage VDD of the half-buffer 512, the acknowledgement signal $ackg_{i-2}$, the data signals $A_{i-2}<0>$ and $A_{i-2}<1>$, the acknowledgement signal $ackg_{i-1}$, the data signals $A_{i-1}<0>$ and $A_{i-1}<1>$, the acknowledgement signal $ackg_i$, the data signals $A_i<0>$ and $A_i<1>$, the acknowledgement signal $ackg_{i+1}$, the data signals $A_{i+1}<0>$ and $A_{i+1}<1>$, the acknowledgement signal $ackg_{i+2}$, the signals rstn, WR, AZ, RD, WRNV, AZNV and RDNV received by the NVM controllers, the signals $WR_{i-1}$, $AZ_{i-1}$ and $RD_{i-1}$ provided to the half-buffer 512 by the corresponding NVM controller 712, the signals $WR_i$, $AZ_i$ and $RD_i$ provided to the half-buffer 514 by the corresponding NVM controller 714, the signals $WR_{i+1}$, $AZ_{i+1}$ and $RD_{i+1}$ provided to the half-buffer 516 by the corresponding NVM controller 716 and the signals $WR_{i+2}$, $AZ_{i+2}$ and $RD_{i+2}$ provided to the half-buffer 518 by the corresponding NVM controller 718.

During a first period 902, an initialization phase occurs in which all flip-flops and C-elements of the pipeline stage are set to an initial state, and all of the non-volatile elements are erased and set to an initial state. Thus the write signals WRNV, WR, $WR_{i-1}$, $WR_i$, $WR_{i+1}$, and $WR_{i+2}$ are asserted.

During a subsequent period 904, standard operation occurs in which data enters and propagates through the pipeline.

During a subsequent period 906, a back-up phase occurs during which the NVM controllers 712 to 718 analyse the state of the pipeline and detect the presence of data in the half-buffers. If data is detected in a stage, it is stored to the local non-volatile memory of the half-buffer. In the example of FIG. 9, data is detected in the half-buffer 518, and thus the signal $WR_{i+2}$ is asserted to write the data of this half-buffer to its non-volatile memory. Shortly after the signal WR is asserted, the signal WRNV is asserted to write the data presence detection bits generated within each controller to the corresponding non-volatile memory.

The pipeline then for example resumes normal operation during a period 908, but then power gating for example occurs, and the supply voltage VDD is brought low during a period 910. At the end of this period, power-up occurs, and the supply voltage VDD is asserted again.

An initialization period 912 then for example occurs, during which the reset signal rstn is applied to all of the flip-flops and C-elements such that they move to a stable logic state.

In a subsequent period 914, a restoration phase occurs, during which the result of the previous data presence detection operation is restored, in each of the controllers of the pipeline, from the non-volatile memory 802 of the flip-flop 614 to the volatile storage of the flip-flop. For this, the signal AZNV is for example brought to a low state, and a short time later the signal RDNV is brought to the high state. The signal AZNV then returns to a high level, and the signal RDNV returns to a low level.

In a subsequent operation 916, restored presence detection bits in each controller are used to control whether or not a restore operation is performed in the corresponding half-buffer. In this example, the local control signal $AZ_{i+2}$ is brought low and a short time later the local control signal $RD_{i+2}$ is brought high to recover the data stored in the non-volatile memory of the half-buffer 518 to its volatile portion.

During a subsequent period 918, the pipeline resumes normal operation from the previously stored state, and the non-volatile memories 802 of the flip-flops 614 of each controller are erased by a high level of the signal WRNV so that the flip-flop is ready for a subsequent data presence detection operation.

While in the example of FIG. 9 a single backup operation is illustrated before power-down, in practise there may be several back-up operations leading up to the power-down phase, each back-up operation over-writing the results of the previous back-up operation.

Figure 10:
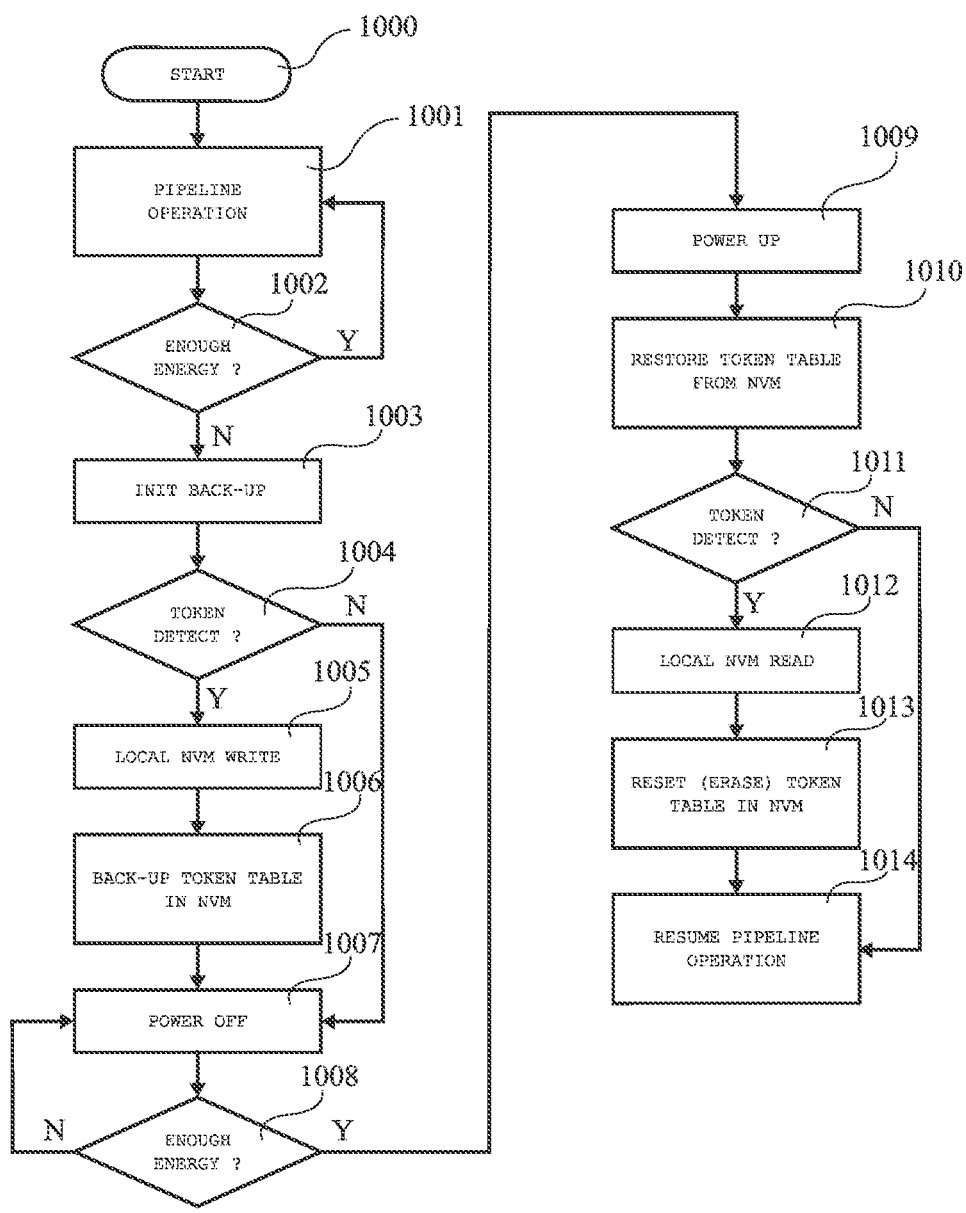
FIG. 10 is a flow diagram illustrating operations in a method of non-volatile data back-up and data restoration according to an example embodiment of the present disclosure.

FIG. 10 is a flow diagram illustrating operations in a method of data back-up and restoration in an asynchronous pipeline, for example the pipeline 600 of FIG. 7, according to an example embodiment. These operations are for example performed by the NVM controllers 712 to 718 and the control circuit 720 of FIG. 7.

From a start point 1000 of the method, in an operation 1001, normal pipeline operation occurs during which data is introduced into the pipeline.

In an operation 1002, it is determined whether or not there is enough energy to power the pipeline. For example, the asynchronous pipeline is part of a portable electronics device powered by a battery, and operation 1002 involves verifying the charge state of the battery. While the energy levels are high, the pipeline operation 1001 for example continues without data back-up. However, when the energy level falls below a certain threshold, the method for example goes to an operation 1003.

In operation 1003, a back-up phase is initiated, for example by asserting the signal WR.

In a subsequent operation 1004, it is determined whether or not the presence of data tokens has been detected in any of the pipeline stages of the pipeline. If so, in a subsequent operation 1005, the data present in each corresponding pipeline stage is stored locally, and in a subsequent operation 1006, a token table is for example updated. The token table is for example a table stored in a non-volatile memory of the control circuit 720 of FIG. 7 and indicates, for each pipeline stage, whether or not data was present at the time of the latest back-up operation. Then, in an operation 1007, the asynchronous pipeline is powered down. Operation 1007 is also performed directly after operation 1004 if no token is detected and the pipeline can therefore be considered to be empty of data.

In a subsequent operation 1008, it is determined whether energy is available once more, for example because a battery supplying the asynchronous pipeline has been charged, or an energy harvester has pumped a supply capacitor with sufficient energy. If not, the method remains in the power off state 1007. If however energy has become available, the next operation is 1009, in which power-up of the asynchronous pipeline occurs.

In a subsequent operation 1010, the token table in the control circuit 720 is for example restored from non-volatile storage, and then it is determined in an operation 1011 whether the latest data presence detection information indicated the presence of any data in the pipeline. For example, the token table contains a bit of data for each pipeline stage indicating whether or not it contained data. If at least one token was present in the pipeline, one or more local non-volatile memory read operations 1012 are performed to restore the pipeline data. Then, in an operation 1013, the token table is reset in the non-volatile memory, and then in an operation 1014, normal pipeline operation is resumed. The normal pipeline operation is also for example resumed straight after operation 1011 if no token is detected in the pipeline.

An advantage of the embodiments described herein is that energy consumption during non-volatile backup of an asynchronous pipeline can be reduced by detecting where data is present in the pipeline, and performing back-up and restoration only in the pipeline stages in which data is present.

Having thus described at least one illustrative embodiment, various alterations, modifications and improvements will readily occur to those skilled in the art. For example, while in the example embodiments each stage of the asynchronous circuit comprises a half-buffer, in alternative embodiments other types of buffering circuits could be used.

Furthermore, it will be apparent to those skilled in the art that the supply voltage VDD in the various embodiments could be at any level, for example between 1 and 3 V, and rather than being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors, for example by inverting the supply rails. Furthermore, while transistors based on MOS technology are described throughout, in alternative embodiments other transistor technologies could be used, such as bipolar technology.

The invention claimed is:

1. An asynchronous circuit comprising:
an asynchronous pipeline comprising two or more stages, each stage having:

a buffering circuit for temporarily storing data to be transferred from one stage to the next based on a handshake protocol, the buffering circuit including a non-volatile memory; and a data presence detection circuit adapted to generate a data presence detection value indicating whether or not data is stored by the buffering circuit; and a control circuit adapted to perform a data back-up operation by independently controlling each buffering circuit to back-up the data it stores to its non-volatile memory based on the corresponding data presence detection value.

2. The asynchronous circuit of claim 1, wherein the data presence detection circuit comprises a further non-volatile memory adapted to store the data presence detection value, wherein the control circuit is adapted to control each data presence detection circuit to restore the data presence detection value from the further non-volatile memory during a power-up phase.

3. The asynchronous circuit of claim 1, wherein each of the data presence detection circuits is adapted to generate the data presence detection value based on the state of an acknowledgement signal received from a next stage of the pipeline, and on an acknowledgement signal generated by the corresponding buffering circuit.

4. The asynchronous circuit of claim 3, wherein the asynchronous pipeline comprises one or more pairs of data lines and an acknowledgement line coupling the buffering circuit of each pipeline stage to the next, wherein the buffering circuits are configured to implement a four-phase handshake protocol for the transfer of a data token from one pipeline phase to the next, the four-phase handshake protocol comprising bringing the acknowledgement signal on the acknowledgement line from a first state to a second state and back to the first state, and wherein the data presence detection circuit of a first pipeline stage is adapted to generate a data presence detection value indicating that data is present in the buffering circuit of the first pipeline stage when the acknowledgement signal from the next pipeline stage is in the first state and the acknowledgement signal generated by the buffering circuit of the first pipeline stage is in the second state.

5. The asynchronous circuit of claim 1, wherein the control circuit comprises a non-volatile memory storing a token table indicating the presence of data tokens in the asynchronous pipeline.

6. The asynchronous circuit of claim 1, wherein the buffering circuit of each pipeline stage is a half-buffer comprising first and second C-elements, each C-element comprising:

first and second input nodes and first and second inverters cross-coupled between first and second complementary storage nodes, the second storage node forming an output node of the C-element; and a non-volatile memory comprising:

a first resistive element having a first terminal coupled to the first storage node;

a second resistive element having a first terminal coupled to the second storage node, at least one of the first and second resistive elements being programmable to have one of at least two resistive states, a data value being represented by the relative resistances of the first and second resistive elements, wherein a second terminal of the first resistive element is coupled to a second terminal of the second resistive element via a first transistor; and wherein the control circuit is adapted, during a backup phase of a data bit stored at the first and second storage nodes to the non-volatile memory, to render conductive the first transistor while different logic levels are applied to the first and second input nodes of the C-element.

7. The asynchronous circuit of claim 6, wherein the first transistor is adapted to conduct a write current during the backup phase, and wherein the circuit of the C-element is arranged such that the write current passes through at least one transistor of each of the first and second inverters during the write phase.

8. The asynchronous circuit of claim 6, wherein:

the first and second C-elements are each adapted to receive a first input signal at the first input node and a second input signal at the second input node; and the first inverter comprises: first and second transistors having their control nodes coupled to the first or second storage node; third and fourth transistors coupled in parallel with each other and coupling the first transistor of the first inverter to a supply voltage rail; and fifth and sixth transistors coupled in parallel with each other and coupling the second transistor of the first inverter to the ground voltage rail.

9. The asynchronous circuit of claim 6, wherein at least one of said first and second resistive elements is one of:

a spin transfer torque element with in-plane anisotropy;

a spin transfer torque element with perpendicular-to-plane anisotropy;

a reduction oxide element;

a ferro-electric element; and a phase change element.

10. A method of data back-up in an asynchronous pipeline comprising two or more pipeline stages, the method comprising:

generating, by a data presence detection circuit of each pipeline stage, a data presence detection value indicating whether or not data is being stored by a buffering circuit of each pipeline stage, the buffering circuits temporarily storing data to be transferred from one stage to the next based on a handshake protocol, each buffering circuit comprising a non-volatile memory; and performing a data back-up operation by independently controlling each buffering circuit to back-up the data it stores to its non-volatile memory based on the corresponding data presence detection value.

* * * * *